US008190926B2

(12) United States Patent
Vinayak et al.

(10) Patent No.: US 8,190,926 B2
(45) Date of Patent: May 29, 2012

(54) POWER COMBINING POWER SUPPLY SYSTEM

(75) Inventors: Vikas Vinayak, Menlo Park, CA (US); Serge Francois Drogi, Flagstaff, AZ (US); Martin Tomasz, San Francisco, CA (US)

(73) Assignee: Quantance, Inc., San Mateo, CA (US)

( * ) Notice: Subject to any disclaimer, the term of this patent is extended or adjusted under 35 U.S.C. 154(b) by 392 days.

(21) Appl. No.: 12/249,717

(22) Filed: Oct. 10, 2008

(65) Prior Publication Data

US 2009/0044031 A1 Feb. 12, 2009

Related U.S. Application Data

(63) Continuation of application No. 11/685,707, filed on Mar. 13, 2007, now Pat. No. 7,454,238.

(60) Provisional application No. 60/863,548, filed on Oct. 30, 2006.

(51) Int. Cl.
*G06F 1/00* (2006.01)
*H04M 1/00* (2006.01)
*H04B 7/00* (2006.01)

(52) U.S. Cl. .................. 713/300; 455/572; 455/522

(58) Field of Classification Search .................. 713/300
See application file for complete search history.

(56) References Cited

U.S. PATENT DOCUMENTS

| 3,900,823 | A | 8/1975 | Sokal et al. |
| 4,346,349 | A | 8/1982 | Yokoyama |
| 4,697,160 | A | 9/1987 | Clark |
| 4,908,565 | A | 3/1990 | Cook et al. |
| 5,200,709 | A | 4/1993 | Saito et al. |
| 5,986,500 | A | 11/1999 | Park et al. |
| 6,084,468 | A | 7/2000 | Sigmon et al. |
| 6,130,525 | A | 10/2000 | Jung et al. |
| 6,175,273 | B1 | 1/2001 | Sigmon et al. |
| 6,292,677 | B1 | 9/2001 | Hagen |
| 6,300,826 | B1 | 10/2001 | Mathe et al. |

(Continued)

FOREIGN PATENT DOCUMENTS

GB    2409115 A    6/2005

(Continued)

OTHER PUBLICATIONS

International Search Report and Written Opinion, PCT/US07/74869, Jul. 27, 2008, 6 pages.

(Continued)

*Primary Examiner* — Suresh Suryawanshi
(74) *Attorney, Agent, or Firm* — Fenwick & West LLP (57) ABSTRACT

A power supply system comprises a low-speed power supply and a high-speed power supply configured to operate in first and second frequency ranges, respectively, and generate first and second outputs, respectively. The lower end of the second frequency range is at least higher than a lower end of the first frequency range. A frequency blocking power combiner circuit combines the power from the first output with the power from the second output to generate a combined, third output for driving a load, while providing frequency-selective isolation between the first and second outputs. A feedback circuit is coupled to receive the combined, third output through a global feedback loop. The feedback circuit generates first and second power supply control signals for controlling the low-speed power supply and the high-speed power supply, respectively, based on a difference between the third output and the predetermined control signal.

25 Claims, 5 Drawing Sheets

U.S. PATENT DOCUMENTS

| | | | |
|---|---|---|---|
| 6,518,856 B1 * | 2/2003 | Casale et al. | 333/124 |
| 6,594,163 B2 | 7/2003 | Tsai | |
| 6,597,242 B2 * | 7/2003 | Petz et al. | 330/51 |
| 6,639,816 B2 | 10/2003 | Liu | |
| 6,661,210 B2 | 12/2003 | Kimball et al. | |
| 6,684,969 B1 | 2/2004 | Flowers et al. | |
| 6,792,252 B2 | 9/2004 | Kimball et al. | |
| 6,984,969 B1 * | 1/2006 | Liu et al. | 323/286 |
| 2003/0158478 A1 | 8/2003 | Petersen et al. | |
| 2004/0203982 A1 | 10/2004 | Barak et al. | |
| 2004/0263254 A1 | 12/2004 | Tahara et al. | |
| 2005/0064830 A1 | 3/2005 | Grigore | |
| 2007/0210771 A1 | 9/2007 | Wilson et al. | |
| 2008/0252380 A1 | 10/2008 | Blanken | |

FOREIGN PATENT DOCUMENTS

| | | |
|---|---|---|
| JP | 55-157356 | 5/1982 |
| JP | 60-052607 | 11/1985 |
| JP | 01-137710 A | 5/1989 |
| JP | 04-129309 A | 4/1992 |
| JP | 2001-519612 | 10/2001 |
| JP | 2008-511065 A | 4/2006 |
| JP | 2008-537249 A | 9/2006 |
| WO | WO 2004/112236 A1 | 12/2004 |
| WO | WO 2005/027297 A2 | 3/2005 |
| WO | WO 2005/041404 A1 | 5/2005 |
| WO | WO 2006/021790 A1 | 3/2006 |
| WO | WO 2006/111891 A1 | 10/2006 |

OTHER PUBLICATIONS

Raab, F.H., "Split-Band Modulator for Kahn-Technique Transmitters," Microwave Symposium Digest, 2004 IEEE MTT-S International, Jun. 6-11, 2004, pp. 887-890, vol. 2.

Anderson, D.R. et al., "High-Efficiency High-Level Modulator for Use in Dynamic Envelope Tracking CDMA RF Power Amplifier," 2001, IEEE MTT-S Digest, pp. 1509-1512.

Dierburger, K. et al., "Simple and Inexpensive High-Efficiency Power Amplifier Using New APT MOSFETs," Nov. 1994, RF Expo East, 14 pages.

Third Party Submissions, European Patent Application No. 07813597.7, Apr. 21, 2010, 5 pages.

Korean Office Action, Korean Patent Application No. 10-2009-7009869, Dec. 6, 2010, 6 pages.

Japanese Office Action, Japanese Application No. 2009-534729, Sep. 16, 2011, 7 pages.

European Extended Search Report, European Application No. 07813597.7, Jul. 5, 2010, 12 pages.

Chinese Office Action, Chinese Application No. 200780040407.5, Dec. 16, 2011, 7 pages.

European Examination Report, European Application No. 07813597.7, Nov. 10, 2011, 5 pages.

Japanese Office Action, Japanese Patent Application No. 2009-534729, Mar. 19, 2012, 4 pages.

* cited by examiner

POWER COMBINING POWER SUPPLY SYSTEM

CROSS-REFERENCE TO RELATED APPLICATIONS

This application is a continuation application of, and claims priority under 35 U.S.C. §120 from, co-pending U.S. patent application Ser. No. 11/685,707, entitled "Power Combining Power Supply System," filed on Mar. 13, 2007, which claims priority under 35 U.S.C. §119(e) from U.S. Provisional Patent Application No. 60/863,548, entitled "Power Combiner," filed on Oct. 30, 2006, the subject matters of both of which are incorporated by reference herein in their entirety.

BACKGROUND OF THE INVENTION

1. Field of the Invention

The present invention relates to a power supply and, more specifically, to a power supply system that combines power output from two or more powers supplies.

2. Description of the Related Art

Many electronic devices tend to require much more sophisticated power supplies for supplying power. For example, many electronics may require high frequency, high overall efficiency, fewer components, and/or low ripple in the power supplied by the power supplies.

More specifically, there is often a need for a power supply circuit that is capable of delivering power with high frequency components (fast changing voltage and current), at high overall power conversion efficiency. For example, an RF (Radio Frequency) PA (power amplifier) can be fed by an efficient power supply at a reduced voltage, allowing the PA to operate more efficiently (i.e., with lower power consumption). In these RF power amplifiers, the power supply must be capable of changing the output voltage very quickly to accommodate rapid changes in the output power of the PA, requiring the power supply to deliver high frequency components of power. At the same time, a high overall efficiency is desired in the power supply to achieve the desired lower power consumption. A typical switched-mode power supply (SMPS) circuit achieves high efficiency, but cannot deliver sufficiently high frequency components of the power, because the low switching frequencies commonly used in these types of regulators (a limitation largely imposed by the magnetics) limits the regulator's bandwidth. Linear regulators, on the other hand, may be designed to deliver high frequency components, but the power conversion efficiency of such a linear regulator is poor. Thus neither a common SMPS nor a linear regulator can meet this need.

Another example of the need for a power supply that is both efficient and can deliver a fast changing voltage and current is one which supplies a digital circuit, which may include a microprocessor. The digital circuit may operate more efficiently if fed by a power supply that adjusts its voltage dynamically to match the predicted processing needs. Typically, the voltage is adjusted upwards when the digital circuit is operating at high speeds, and downward when operating at lower speeds. While conventional power supplies can typically change their voltage within 50 µs, this delay may prevent the digital circuitry from operating at peak efficiency, and a power supply which adjusts its voltage more quickly to allow for a more frequent change in clocking speeds of the digital circuitry is desirable.

There is also a need to reduce the number of components used in switching power supply circuits, such as output capacitors and inductors, and the associated costs of using such capacitors and inductors. The output capacitors often used are a large value, a low-ESR (Equivalent Series Resistance) type, requiring the use of large electrolytic capacitors with exotic electrolytes. These output capacitors are required to reduce the ripple voltage caused by repetitive currents from the switching action of the regulator appearing at the output of the power supply. The quantity and quality of these capacitors add greatly to the cost of the power supply, and the volume added to by these capacitors may be unattractive for use in portable electronic devices. Additionally, the low-ESR capacitors may also be undesirable, as the electrolytes can be flammable and create a fire hazard. In addition, some high-current switching regulator circuits use several inductors, with a controller which phases the switching of the inductors to reduce output ripple. The use of multiple inductors undesirably adds to the cost of the power supply.

Further, a low voltage ripple is desirable in switching power supplies. For example, modern microprocessors are increasingly operated at low voltages due to increased chip density and lower voltage breakdown in advanced CMOS (Complementary Metal Oxide Semiconductor) technology. At these low voltages, the power supply ripple may be a substantial portion of the supply voltage. High ripple may undesirably require the power supply output voltage to be raised above the optimal level in order to ensure that the microprocessor is supplied with the minimal voltage required during periods when the ripple voltage drives the voltage excursions to a minimum. As an additional example, a RF PA requires its power supply to exhibit low ripple at its output. Ripple typically occurs synchronously to the switching frequency of the switching regulator and can feed through to the output of the PA, causing unwanted distortion in the RF output signal.

There have been some efforts to improve the conventional switching regulator circuits. For example, one could use both a switching regulator and a linear regulator and have a simple summing node to combine outputs from the linear regulator and the switching regulator to form the output of the power supply, with the intention that the linear regulator provides the high frequency, and the switching regulator provides the low frequency and DC components of the current to the load. These circuits, however, place a lot of burden on the linear regulator, as it requires the linear regulator to supply a large amount of excess current to modulate the voltage in the large capacitors needed by the switching regulator. Alternatively, a switching regulator and linear regulator may be placed in series, with the switching regulator's output feeding the linear regulator's input. In this arrangement, the linear regulator may be capable of delivering high frequency components of the power, while the switching regulator may deliver power efficiently to the linear regulator. However, this series arrangement forces all the power delivered to the load to pass through the linear regulator, causing dissipation in the linear regulator and substantially reducing the overall efficiency of the power supply.

Therefore, there remains a need for a power supply system that has high overall efficiency, high bandwidth, and low voltage ripple, and one that uses a reduced number of components.

SUMMARY OF THE INVENTION

Embodiments of the present invention include a power supply system comprising a low-speed power supply configured to operate in a first frequency range and generate a first output, a high-speed power supply configured to operate in a second frequency range and generate a second output where a lower end of the second frequency range is at least higher than a lower end of the first frequency range, a frequency blocking power combiner circuit combining a first power of the first output with a second power of the second output to generate a combined, third output for driving a load while providing frequency-selective isolation between the first output and the second output, and a feedback circuit coupled to receive the combined, third output through a global feedback loop. The feedback circuit compares the third output with a predetermined control signal and generates a first power supply control signal for controlling the low-speed power supply and a second power supply control signal for controlling the high-speed power supply based on a difference between the third output and the predetermined control signal. The low-speed power supply can be a switched mode power supply (SMPS) and the high-speed power supply can be a push-pull regulator.

In one embodiment, the feedback circuit includes an error amplifier comparing the third output with a predetermined control signal to generate the first power supply control signal and the second power supply control signal. In still another embodiment, the feedback circuit includes a low pass filter coupled in series with the low-speed power supply, where the first power supply control signal is passed through the low pass filter. In still another embodiment, the feedback circuit includes a high pass filter coupled in series with the high-speed power supply, where the second power supply control signal is passed through the high pass filter.

In one embodiment, the frequency blocking power combiner circuit includes an inductor coupled in series with the first output of the low-speed power supply. In another embodiment, the frequency blocking power combiner circuit includes an inductor coupled in series with the first output of the low-speed power supply, and a capacitor coupled in series with the second output of the high-speed power supply. In still another embodiment, the frequency blocking power combiner circuit includes a transformer including a primary winding with a first node and a second node and a secondary winding with a third node and a fourth node, the first node coupled to receive the first output, the second node coupled to the load, the third node coupled to ground, and the fourth node coupled to receive the second output. The frequency blocking power combiner circuit may also include a capacitor coupled to the high-speed power supply and the fourth node of the transformer on one end and to the load on another end, where the capacitor reduces effects of a primary leakage inductance of the transformer.

The power combining power supply system according to the present invention has at least the following advantages, which will be explained in detail later. First, the power supply system has a high bandwidth while maintaining good efficiency. Second, fewer capacitors are needed in the power supply system, and the need for low-ESR capacitors are reduced compared to a standard SMPS. Third, residual voltage ripple is reduced without excessive current and efficiency loss in the high-speed power supply. Fourth, the number of stages in a multi-phase switching power supply may be reduced, compared to a standard SMPS, allowing a reduction in the number of inductors used. Fifth, the high-speed power supply portion of the circuit may be integrated into a digital circuit or a microprocessor circuit to more accurately control the output voltage at the point of load.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present invention can be readily understood by considering the following detailed description in conjunction with the accompanying drawings.

DETAILED DESCRIPTION OF EMBODIMENTS

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 1A:
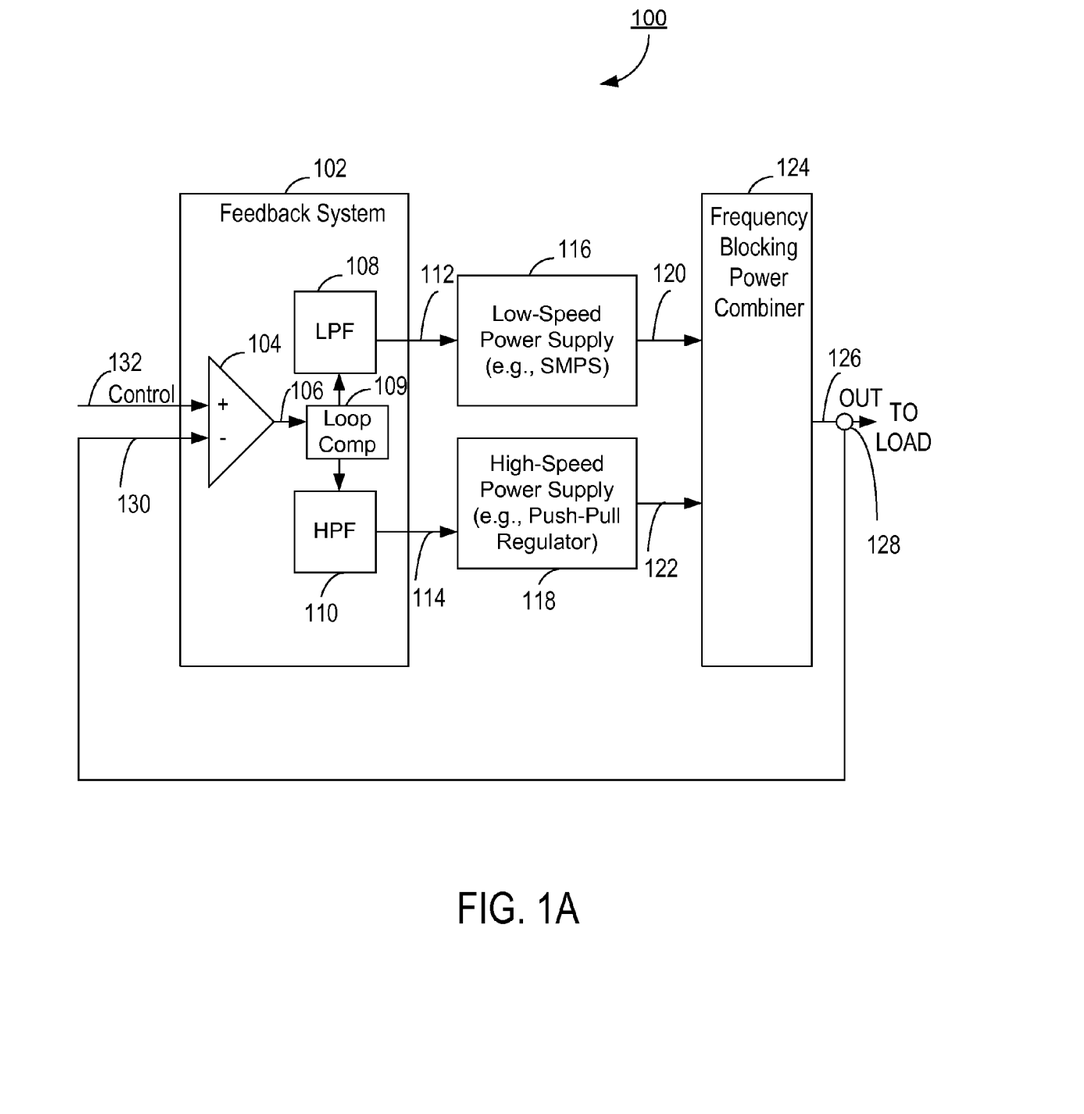
FIG. 1A illustrates a power supply system of the present invention.

FIG. 1A illustrates a power supply system 100 of the present invention. The power supply system 100 includes a low-speed power supply 116 (e.g., SMPS), a high-speed power supply 118 (e.g., push-pull regulator), a frequency blocking power combiner 124, and a feedback system 102. Referring to FIG. 1A, the high-speed power supply 118 (e.g., push-pull regulator) is paired with the low-speed power supply 116 (e.g., switched-mode power supply (SMPS)). The low-speed power supply 116 is configured to operate in a first frequency range, and the high-speed power supply 118 is configured to operate in a second frequency range, where the lower end of the second frequency range is at least higher than the lower end of the first frequency range. The power at the output 120 of the low-speed power supply 116 and the power at the output 122 of the high-speed power supply 118 are combined in the frequency blocking power combiner 124 to produce an output supply voltage (OUT) 126. As will be shown in further detail with reference to FIGS. 1B and 1C, the frequency blocking power combiner 124 provides frequency-selective blocking to provide frequency-selective isolation between the output 120 of the low-speed power supply 116 and the output 122 of the high-speed power supply 118 as well as combines the power at outputs 120, 122 to generate the output supply voltage 126. Note that the power supply system 100 of FIG. 1A may be implemented by any one of the embodiments shown in FIGS. 1B and 1C. A load (not shown) is connected to the output 126 of the frequency blocking power combiner 124.

The output signal 126 of the frequency blocking power combiner 124 is sensed via a sensor 128 and fed back as a feedback signal 130 to the feedback system 102. Sensing via sensor 128 may be simply a wired connection, or may be accomplished with a resistive divider, for example. The feedback system 102 includes an error amplifier 104, a loop compensation (Loop Comp) block 109, a low pass filter (LPF) 108 and a high pass filter (HPF) 110. The error amplifier 104 compares the feedback signal 130 with a predetermined control signal 132 representing the desired output voltage at the output 126 of the power supply system 100. The error amplifier 104 generates an error voltage 106 based on the difference between the feedback signal 130 and the control voltage 132. The loop compensation (Loop Comp) block 109, the low pass filter (LPF) 108, and the high pass filter (HPF) 110 will be explained below with reference to FIG. 1B.

The feedback system 102 generates a low-speed power supply control signal 112 and a high-speed power supply control signal 114 based on the error voltage 106. The low speed power supply 116 regulates its output voltage 120 based on the low-speed power supply control signal 112, and the high-speed power supply 118 regulates its output voltage 122 based on the high-speed power supply control signal 114.

The feedback system 102 is useful because the frequency response of the low-speed signal path (including LPF 108 and the low-speed power supply 116), when combined with the frequency response of the high-speed signal path (including the HPF 110 and the high speed power supply 118), may yield an uneven frequency response. For example, the frequency response of the low-speed power supply 116 may overlap with the frequency response of the high speed power supply 118, causing some frequency components to be over-emphasized. Additionally, the frequency blocking power combiner 124 may distort the frequency content of the output voltages 120, 122 from the low-speed power supply 116 and the high-speed power supply 118, respectively. The feedback loop 130 enables the feedback system 102 to shape the frequency contents of the low-speed power supply control signal 112 and the high-speed power supply control signal 114, so that the resulting signal at the output 126 of the power supply system 100 matches the frequency content at the control signal 132. Thus, the use of the feedback system 102 improves the accuracy of the frequency response.

Figure 1B:
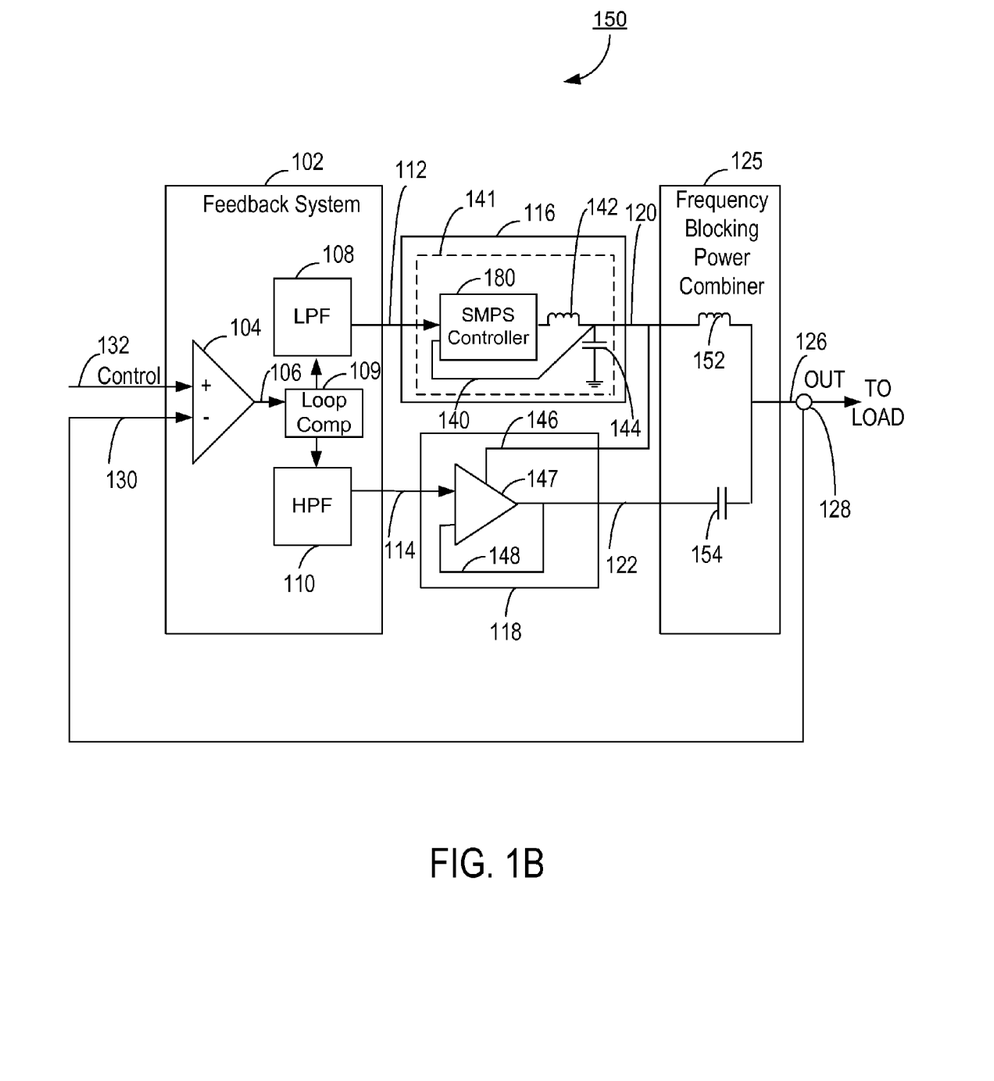
FIG. 1B illustrates a power supply system with a frequency blocking power combiner according to the first embodiment of the present invention.

FIG. 1B illustrates a power supply system 150 with a frequency blocking power combiner 125 according to the first embodiment of the present invention. The power supply system 150 includes a low-speed power supply 116, comprising SMPS 141 in this example. The SMPS 141 includes an SMPS controller 180, an inductor 142, an output capacitor 144, and a local feedback loop 140 for regulating the SMPS 141. Note that FIG. 1B merely illustrates a simplified conceptual view of the SMPS 141, and not all components of the SMPS 141 are shown in FIG. 1B. The SMPS 141 can be, in this example, a step-down (buck) design, with inductor 142 being the switching inductor of the SMPS 141 and the capacitor 144 being the output capacitor of the SMPS 141, although other switching regulator topologies could be used. The SMPS controller 180 operates by attempting to equalize the voltage at the low-speed power supply control 112 with the voltage at its output 120. Other details of the SMPS controller 180 are not necessary to be described herein to illustrate the present invention.

The power supply system 150 also includes a high-speed power supply 118 comprised of a push-pull regulator 147 and a local feedback loop 148 for regulating the push-pull regulator 147. The push-pull regulator 147 differs from a standard linear regulator, in that it can both sink and source current, and is typically less efficient than a SMPS. As shown with line 146, the push-pull regulator 147 may be supplied by the output 120 of the SMPS 141, for improved efficiency, in this example. Alternatively, the input of the push-pull regulator 147 could be connected to a different supply rail that is the minimum that could support the voltage swing of the push-pull regulator 147, to further optimize the efficiency of the high-speed power supply 118.

Referring to FIG. 1B, the low pass filter (LPF) 108 of the feedback system 102 is connected in series with the low-speed power supply 116. The LPF 108 improves the efficiency of the SMPS 141 by lowering the maximum frequencies to which the SMPS controller 180 will attempt to regulate. High frequencies passed into the SMPS 141 could result in high currents through the inductor 142 as it generates current into and out of its output capacitor 144 in an attempt to drive the voltage of the output capacitor 144 at such high frequencies.

The high pass filter (HPF) 110 of the feedback system 102 is also connected in series with the control line 114 of the high-speed power supply 118. One benefit of this HPF 110 is that it may allow the circuitry in the high-speed power supply 118 to accept the high-speed power supply control line 114 with the DC level and low frequencies reduced, which may allow additional flexibility in the design of the high-speed power supply 118.

The loop compensation block 109 optionally shapes a frequency response of the overall loop of the power supply system 150 to enhance stability. This function includes gain reduction at high frequencies as required by any control loop. Portions of the desired frequency shaping may naturally occur within any of the blocks in the power supply system 150, and therefore this function may be distributed within these blocks. In this case, the loop compensation block 109 may not be needed.

The frequency blocking power combiner 125 in the first embodiment of FIG. 1B includes an inductor 152 to form a low pass network and a capacitor 154 to form a high pass network. The inductor 152 selectively passes power at low frequencies from the SMPS 141, and the capacitor 154 selectively passes power at high frequencies from the push-pull regulator 147. Thus, an important aspect of the frequency blocking power combiner network 125, especially the inductor 152, is that it isolates (blocks) the SMPS output capacitor 144 from being driven by the high-speed power supply output 122 at higher frequencies. If the high-speed power supply 118 were to drive the output 120 of the SMPS output capacitor 144 at high frequencies, the high-speed power supply 118 would have to generate high current into and out of the output capacitor 144 of the SMPS 141, resulting in significant power loss and loss in efficiency. The frequency blocking power combiner 125 thus prevents such power loss and enables efficient operation of the combined low-speed and high-speed power supplies 116, 118.

Note that the SMPS 141 typically generates a high frequency sawtooth ripple waveform at its output 120. Inductor 152 in the frequency blocking power combiner 125 filters this ripple, reducing the level of the ripple at output 126. Then the push-pull regulator 147 may substantially remove the remaining ripple from output 126, since the ripple frequency may be within the operating bandwidth of the push-pull regulator 147, allowing the power supply system 150 to operate with very low output ripple. Thus, the combined benefits of ripple filtering from the frequency blocking power combiner 125, and the removal of the remaining ripple by the push-pull regulator 147, permits SMPS 141 to produce a larger level of output ripple at SMPS output 120, and therefore allows a substantially reduced output capacitance at capacitor 144 when compared with a standard SMPS, saving cost and volume. Additionally, expensive low-ESR capacitors, which are commonly used in standard SMPS circuits to further reduce ripple, are no longer required. Finally, if SMPS 141 were replaced with a multi-phase SMPS, a common topology used to limit output ripple, the number of phases may be reduced compared with a standard multi-phase SMPS, resulting in a reduced number of magnetics components required.

If the output 122 of the push-pull regulator 147 were connected directly to the output 120 of the SMPS 141 through a simple summing node, the push-pull regulator 147 would attempt to remove the ripple at the output 120 of the SMPS 141. Since the level of ripple at output 120 of the SMPS 141 is substantially higher than at output 126, the power dissipation in the push-pull regulator 147 would be substantially higher. In this regard, the ripple filtering which the frequency blocking power combiner 125 provides allows the power supply system 150 to operate with good efficiency.

The SMPS 141 can be designed to have a loop bandwidth that allows it to regulate frequency components from typically DC to a frequency which may be, for example, at least as large as what the frequency blocking power combiner 125 will allow it to pass. Similarly, the push-pull regulator 147 can be designed to pass frequencies far below the AC cut-in frequency of the frequency blocking power combiner 125. With these overlapping frequency responses, power across all necessary frequencies, up to the frequencies allowed by the loop compensation 109 in the feedback system 102, may be passed to provide the combined output power 126. Further, as described previously, the feedback loop 130 enables the feedback system 102 to shape the frequency contents of the low-speed power supply control signal 112 and the high-speed power supply control signal 114, so that even with an overlapping or uneven frequency response of the combined SMPS 141 and push-pull regulator 147, the resulting signal at the output 126 of the power supply system 150 can be made to match the frequency content at the control signal 132.

Figure 1C:
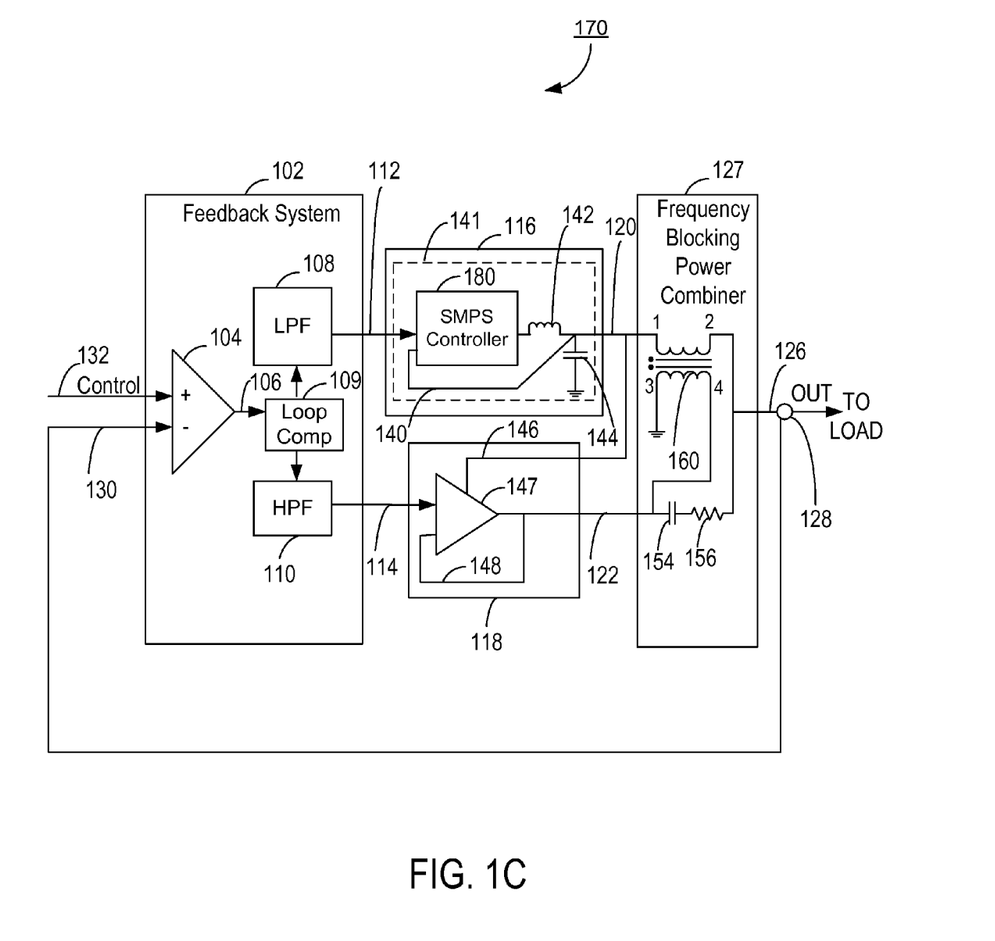
FIG. 1C illustrates a power supply system with a frequency blocking power combiner according to the second embodiment of the present invention.

Note that in the example shown in FIGS. 1B and 1C, each of the SMPS 141 and the push-pull regulator 147 has its own local regulation loop. Within these local regulation loops, either or both of the SMPS 141 and the push-pull regulator 147 may be designed to exhibit an output impedance greater than 10% of the minimum equivalent impedance seen at the load of the power supply system 150. Further, the SMPS 141 and the push-pull regulator 147 may have low open loop gains. Both of these refinements help reduce the amount of current shuttling between the outputs 120 of the SMPS 141 and the output 122 of the push-pull regulator 147 at the resonant frequency formed by the inductor 152 and the capacitor 154 in the frequency blocking power combiner network 125.

It is desirable for the push-pull regulator 147 to have a DC (Direct Current0 operating point that allows its output 122 to maximize its signal swing. In one embodiment, the DC operating point is equal to the output voltage 120 of the SMPS 141 divided by two, but depending on the design of the push-pull regulator 147 and the AC voltage swings required, this operating point may be changed, possibly dynamically.

FIG. 1C illustrates a power supply system 170 with a frequency blocking power combiner 127 according to the second embodiment of the present invention. The power supply system 170 of FIG. 1C is substantially the same as the power supply system 150 of FIG. 1B, except that the frequency blocking combiner 127 in this embodiment is comprised of the transformer 160, the capacitor 154, and the resistor 156.

The frequency blocking power combiner 127 in this embodiment includes a transformer 160 to sum the output current 122 from the push-pull regulator 147 to the output current 120 from the SMPS 141. As shown in FIG. 1C, the transformer 160 has its node 1 coupled to the output 120 of the SMPS 141, node 2 coupled to the output 126 of the power supply system 170, node 3 coupled to ground, and node 4 coupled to the output 122 of the push-pull regulator 147. The primary side of the transformer 160 acts as a low pass filter for the output 120 of the SMPS 141 and thus provides the ripple filtering function described in conjunction with FIG. 1B. This configuration also allows the push-pull regulator 147 to affect the voltage at the load through node 2 of the transformer 160, while node 1 of the transformer 160 approaches a short circuit to ground at high frequencies through capacitor 144. In this case, the frequency blocking power combiner 127 could be construed to include the output capacitor 144 of the SMPS 141. The windings ratio of the transformer 160 may be set to optimize the swing level required by the push-pull regulator 147.

The frequency blocking power combiner 127 also includes a capacitor 154 and a resistor 156 connected in series with the output 122 of the push-pull regulator 147. The capacitor 154 is used to compensate for the leakage inductance at the primary side (nodes 1 and 2) of the transformer 160, by resonating this leakage inductance with the capacitor 154. The resistor 156 flattens the frequency response created by the capacitor 154.

As in the power supply system 150 of FIG. 1B, the feedback system 102 includes a low pass filter 108 in series with the SMPS control line 112, improving the efficiency in the SMPS 141 by lowering the maximum frequencies to which the SMPS controller 180 needs to regulate. Also, the feedback system 102 includes a high pass filter 110 in series with the high-speed power supply control line 114. In this case, the high pass filter 110 prevents DC power from driving the primary side (nodes 1 and 2) of the transformer 160 in the frequency blocking power combiner 127. Alternatively, a capacitor (not shown) at the output 122 of the high-speed power supply 118 may also be used to perform this function.

Note, finally, that the architecture of the embodiments shown in FIG. 1B or FIG. 1C allows for a simple physical partitioning of the low-speed power supply 116 and the high-speed power supply 118. As an example, the high-speed power supply 116 may be integrated into the same integrated circuit which the power supply system is required to power, thus delivering the high-bandwidth portion of power close to the point of load, minimizing phase lag and loss associated with wires or printed circuit board traces and increasing the allowable bandwidth of the overall power supply loop.

Figure 2:
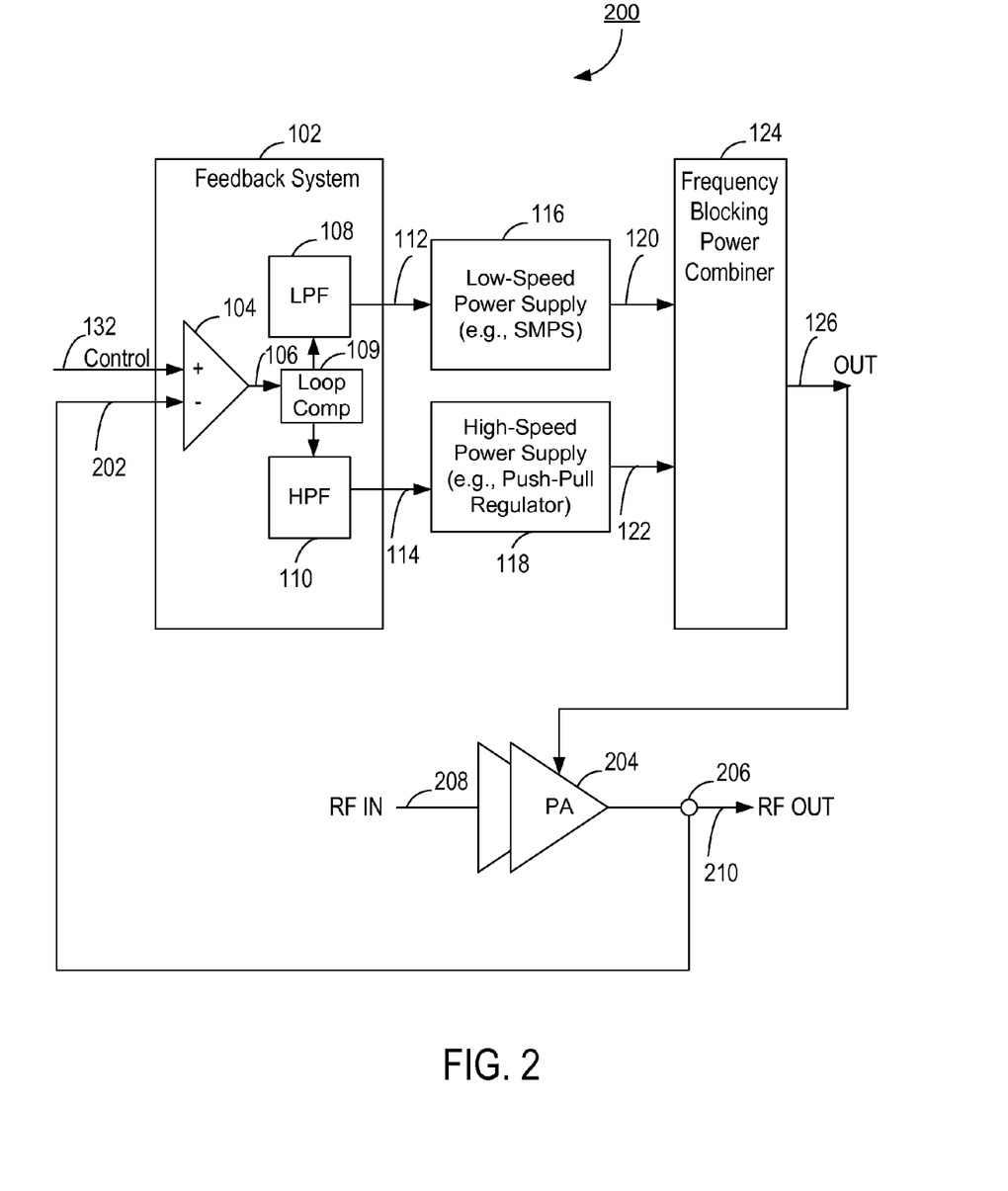
FIG. 2 illustrates a variation of the power supply system of the present invention.

FIG. 2 illustrates a different variation of the power supply system of the present invention. The power supply system 200 of FIG. 2 is substantially the same as the power supply system 100 of FIG. 1A, except (i) that the output 126 of the power supply system 200 is used as the supply voltage to a radio frequency power amplifier (RF PA) 204 that receives and amplifies an RF input signal 208 and generates an RF output signal 210 and (ii) that the RF output signal 210 is sensed 206 and provided as the feedback signal 202 to the feedback system 102 of the power supply system 200. Note that the frequency blocking power combiner 124 of FIG. 2 may also be implemented as illustrated in FIG. 1B or FIG. 1C as the first or second embodiment.

Figure 3:
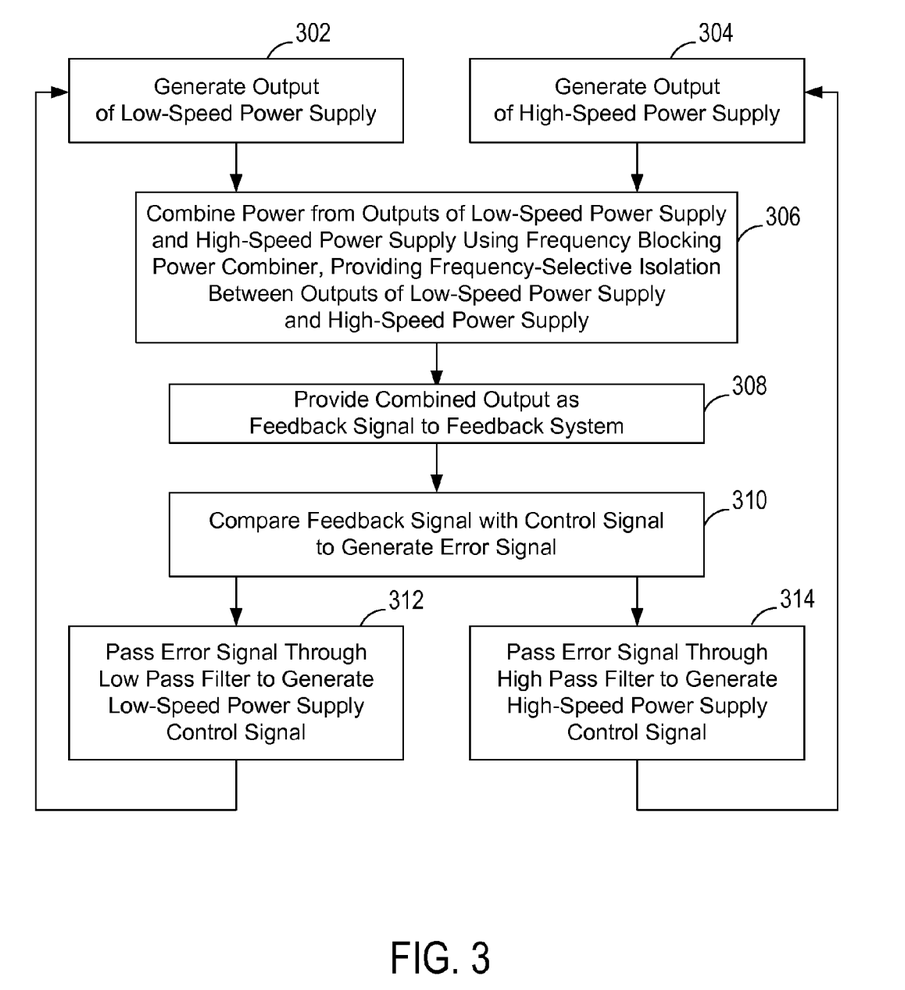
FIG. 3 illustrates a method of generating power from a power supply according to the present invention.

FIG. 3 illustrates a method of generating power from a power supply according to the present invention. Referring to FIG. 3 together with FIG. 1A, the low-speed power supply 116 generates 302 its output 120 and the high-speed power supply 118 generates 304 its output 122. Then, the frequency blocking power combiner 124 combines 306 the power from output 120 from the low-speed power supply 116 and the power from output 122 from the high-speed power supply 118 to generate the combined output 126 while providing frequency-selective isolation between the outputs 120, 122. The combined output 126 is provided 308 as the feedback signal 130 to the feedback system 102. The error amplifier 104 in the feedback system 102 compares 310 the feedback signal 130 with a control signal 132 to generate an error signal 106. The error signal is passed 312 through the low pass filter 108 to generate the low-speed power supply control signal 112, and the error signal is passed 314 through high pass filter 110 to generate the high-speed power supply control signal 114. Then, the process returns to steps 302, 304 to generate the outputs 120, 122 based on the low-speed power supply control signal 112 and the high-speed power supply control signal 114, respectively.

Upon reading this disclosure, those of ordinary skill in the art will appreciate still additional alternative structural and functional designs for a power combining power supply system through the disclosed principles of the present invention. Thus, while particular embodiments and applications of the present invention have been illustrated and described, it is to be understood that the invention is not limited to the precise construction and components disclosed herein. Various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A power supply system, comprising:
a first power supply configured to operate in a first frequency range and generate a first output;
a second power supply configured to operate in a second frequency range and generate a second output, a lower end of the second frequency range being at least higher than a lower end of the first frequency range;
a power combiner circuit combining the first output with the second output to generate a third output for driving a load; and
a feedback circuit coupled to receive the third output through a feedback loop, the feedback circuit comparing the third output with a predetermined control signal and generating one or more power supply control signals for controlling the first power supply and the second power supply based on a difference between the third output and the predetermined control signal,
wherein an output impedance of at least one of the first power supply and the second power supply is set to greater than 10% of a minimum equivalent impedance seen at the load of the power supply system.

2. The power supply system of claim 1, wherein the first power supply is a switched mode power supply (SMPS).

3. The power supply system of claim 1, wherein the second power supply is a push-pull regulator.

4. The power supply system of claim 1, wherein the feedback circuit includes an error amplifier comparing the third output with the predetermined control signal to generate said one or more power supply control signals.

5. The power supply system of claim 1, wherein said one or more power supply control signals include a first power supply control signal for controlling the first power supply and a second power supply control signal for controlling the second power supply.

6. The power supply system of claim 5, wherein the feedback circuit includes a low pass filter coupled in series with the first power supply, the first power supply control signal passed through the low pass filter.

7. The power supply system of claim 5, wherein the feedback circuit includes a high pass filter coupled in series with the second power supply, the second power supply control signal passed through the high pass filter.

8. The power supply system of claim 1, wherein the power combiner circuit includes an inductor coupled in series with the first output of the first power supply.

9. The power supply system of claim 8, wherein the power combiner circuit includes a capacitor coupled in series with the second output of the second power supply.

10. The power supply system of claim 1, wherein the power combiner circuit includes a transformer including a primary winding with a first node and a second node and a secondary winding with a third node and a fourth node, the first node coupled to receive the first output, the second node coupled to the load, the third node coupled to ground, and the fourth node coupled to receive the second output.

11. The power supply system of claim 10, wherein the power combiner circuit further includes a capacitor coupled to the first power supply and the fourth node of the transformer on one end and the load on another end, the capacitor reducing effects of a primary leakage inductance of the transformer.

12. The power supply system of claim 11, wherein the power combiner circuit further includes a resistor coupled in series between the capacitor and the load.

13. A method of generating power, the method comprising:
generating a first output using a first power supply configured to operate in a first frequency range;
generating a second output using a second power supply configured to operate in a second frequency range, a lower end of the second frequency range being at least higher than a lower end of the first frequency range;
combining the first output with the second output to generate a third output for driving a load; and
providing the third output through a feedback loop and comparing the third output with a predetermined control signal to generate one or more power supply control signals for controlling the first power supply and the second power supply based on a difference between the third output and the predetermined control signal; and
setting an output impedance of at least one of the first power supply and the second power supply to greater than 10% of a minimum equivalent impedance seen at the load.

14. The method of claim 13, wherein said one or more power supply control signals include a first power supply control signal for controlling the first power supply and a second power supply control signal for controlling the second power supply.

15. The method of claim 14, further comprising passing the first power supply control signal through a low pass filter coupled in series with the first power supply.

16. The method of claim 14, further comprising passing the second power supply control signal through a high pass filter coupled in series with the second power supply.

17. The method of claim 13, further comprising passing the first output through an inductor coupled in series with the first power supply.

18. The method of claim 17, further comprising passing the second output through a capacitor coupled in series with the second power supply.

19. The method of claim 13, wherein the first output and the second output are combined using a transformer including a primary winding with a first node and a second node and a secondary winding with a third node and a fourth node, the first node coupled to receive the first output, the second node coupled to a load, the third node coupled to ground, and the fourth node coupled to receive the second output.

20. The method of claim 19, wherein the second output is passed through a capacitor coupled to the first power supply and the fourth node of the transformer on one end and to the load on another end, the capacitor reducing effects of primary leakage inductance of the transformer.

21. A power supply system for providing power supply to a radio frequency (RF) power amplifier, the power supply system comprising:
 a first power supply configured to operate in a first frequency range and generate a first output;
 a second power supply configured to operate in a second frequency range and generate a second output, a lower end of the second frequency range being at least higher than a lower end of the first frequency range;
 a power combiner circuit combining the first output with the second output to generate a third output for providing the power supply of the RF power amplifier, the RF power amplifier receiving and amplifying a RF input signal to generate a RF output signal under control of the third output; and
 a feedback circuit coupled to receive the RF output signal through a feedback loop, the feedback circuit comparing an amplitude of the RF output signal with a predetermined control signal and generating one or more power supply control signals for controlling the first power supply and the second power supply based on a difference between the RF output signal and the predetermined control signal.

22. The power supply system of claim 21, wherein the first power supply is a switched mode power supply (SMPS), and the second power supply is a push-pull regulator.

23. The power supply system of claim 21, wherein said one or more power supply control signals include a first power supply control signal for controlling the first power supply and a second power supply control signal for controlling the second power supply.

24. The power supply system of claim 23, wherein the feedback circuit includes a low pass filter coupled in series with the first power supply, the first power supply control signal being passed through the low pass filter.

25. The power supply system of claim 21, wherein the power combiner circuit includes an inductor coupled in series with the first output of the first power supply, and a capacitor coupled in series with the second output of the second power supply.

* * * * *